(12) United States Patent  
Leader et al.

(10) Patent No.: US 6,667,918 B2  
(45) Date of Patent: Dec. 23, 2003

(54) SELF-REPAIR OF EMBEDDED MEMORY ARRAYS

(75) Inventors: Yuval Leader, Zurit (IL); Zvi Shmueli, Kibbutz Hasolelim (IL); Boaz Ben-Nun, Kiryat Ono (IL); Yuval Eliyahu, Petah-Tikva (IL); Eitan Zahavi, Zichron Yaakov (IL)

(73) Assignee: Mellanox Technologies Ltd., Yokneam (IL)

( * ) Notice: Subject to any disclaimer, the term of this patent is extended or adjusted under 35 U.S.C. 154(b) by 37 days.

(21) Appl. No.: 10/135,361

(22) Filed: May 1, 2002

(65) Prior Publication Data

US 2003/0206470 A1 Nov. 6, 2003

(51) Int. Cl.⁷ ............................. G11C 7/00; G01R 31/28
(52) U.S. Cl. ....................................... 365/201; 714/733
(58) Field of Search ........................ 365/201, 189.02, 365/200; 714/733, 734

(56) References Cited

U.S. PATENT DOCUMENTS

| 5,764,878 | A | | 6/1998 | Kablanian et al. ..... 395/182.05 |
| 5,920,515 | A | | 7/1999 | Shaik et al. ................. 365/200 |
| 6,011,734 | A | | 1/2000 | Pappert ....................... 356/200 |
| 6,067,262 | A | * | 5/2000 | Irrinki et al. ................ 365/201 |
| 6,259,637 | B1 | | 7/2001 | Wood et al. ................. 365/200 |
| 6,304,499 | B1 | | 10/2001 | Poechmueller .............. 365/200 |
| 6,367,042 | B1 | * | 4/2002 | Phan et al. .................. 714/733 |
| 6,504,772 | B2 | * | 1/2003 | Maeno ......................... 365/201 |

\* cited by examiner

*Primary Examiner*—Anh Phung
(74) *Attorney, Agent, or Firm*—Oblon, Spivak, McClelland, Maier & Neustadt, P.C.

(57) ABSTRACT

An embedded memory unit includes a memory array having a design size given by an integer n, the array including a matrix of memory cells arranged in n+1 lines, and selection circuitry, coupled to select n of the n+1 lines to which data are to be written and from which the data are to be read. A built-in self-test (BIST) circuit is coupled to test the memory array and to generate a binary pass/fail output. A repair machine is coupled to receive the binary output of the BIST circuit and to drive the selection circuitry to select different sets of n of the lines while driving the BIST circuit to test the memory array, so as to find one of the different sets for which the binary output indicates that the array has passed the self-test.

18 Claims, 4 Drawing Sheets

SELF-REPAIR OF EMBEDDED MEMORY ARRAYS

FIELD OF THE INVENTION

The present invention relates generally to memory arrays used in integrated circuit devices, and specifically to built-in mechanisms for replacing defective cells in such a memory array.

BACKGROUND OF THE INVENTION

The use of embedded memory arrays in Very Large Scale Integrated (VLSI) circuit devices is increasing. Such memory arrays enhance the ability of devices to support high-capacity and high-bandwidth applications. Memories, however, are typically subject to higher process defect-related failures than other elements of VLSI design, such as logic gates. Therefore, the use of embedded memory arrays typically makes devices more susceptible to failures due to manufacturing defects. As total memory on a device gets larger, the memory yield, and hence the device yield, may be dramatically reduced.

It is common practice to include redundant rows and columns in an embedded memory array. These redundant elements can be activated to repair defects inside the memory array. Typically, as part of the device manufacturing flow, the memories are tested, and defective bits in the arrays are detected. The memory array is then repaired by replacing the defective bits with rows or columns selected from the redundant rows and columns. The selection information (i.e., which rows/columns to use) is stored in a special non-volatile memory, typically implemented as a set of dedicated metal fuses, which are fabricated as part of the device. Programming the fuses requires a special step in the manufacturing process, wherein specialized and costly laser equipment is used to blow out selected fuses. Although fuse technology can help to increase device yield, the fuses themselves occupy a substantial area on the chip, therefore increasing device size. The additional manufacturing steps involved in blowing the selected fuses increase cost and can themselves reduce yield.

As an alternative to fuse technology, some VLSI devices with embedded memory arrays include Built-In Self-Test (BIST) circuits, which work together with on-chip repair logic to bypass faulty cells in the array. Such schemes are referred to generally as self-repair systems. As in fuse-based repair schemes, the memory array used for self-repair includes redundant rows and, in some cases, redundant columns. When the BIST circuit detects a fault at a given address in the array, it directs the repair logic to substitute one of the redundant array elements (typically either a cell or an entire row) for the faulty element. Thereafter, reads and writes addressed to the faulty array element are redirected by the repair logic to the redundant element that has been substituted for it.

A variety of self-repair schemes are described in the patent literature. For example, U.S. Pat. No. 5,764,878, whose disclosure is incorporated herein by reference, describes a built-in self-repair system for embedded memories, which is triggered automatically on power-up of the computer in which it is installed. The system includes a BIST circuit that tests for defective row memory lines or defective I/O memory blocks. (An I/O memory block is described as comprising at least one column memory line, but typically includes a plurality of column memory lines grouped together to form an I/O memory block.) When the address of a defective row line or I/O block is detected, it is dynamically repaired by a fault-latching and repair execution circuit, which reroutes the address locations of the defective row or block to new address locations associated with redundant rows or blocks.

The need to look up addresses of redundant rows that are used to substitute for defective rows can substantially increase the access time to the memory. U.S. Pat. No. 5,920,515, whose disclosure is incorporated herein by reference, describes a register-based redundancy circuit and method for built-in self-repair in a semiconductor memory device, which is aimed at solving this problem. The redundancy circuits are associated with failed row address stores to drive redundant row word lines, so that it is not necessary to supply and decode a substitute address in the normal way. The patent states that by providing redundancy handling at the predecode circuit level, rather than at a preliminary address substitution stage, access times to the memory array are improved.

As another example, U.S. Pat. No. 6,011,734, whose disclosure is incorporated herein by reference, describes a fuseless memory repair system, which uses a BIST circuit to determine a specific address at which a memory failure is detected. The address is stored in a latch. During normal operation, the address stored in the latch is compared to addresses being accessed in the memory. When a match occurs, a "HIT" signal is generated, which disables selection of the defective row in the memory array. A redundant row select signal selects the redundant row to replace the defective row.

U.S. Pat. No. 6,259,637, whose disclosure is also incorporated herein by reference, describes a method and apparatus for built-in self-repair of memory storage arrays. The memory array is produced with a number of redundant rows and redundant columns. A test circuit coupled to the memory array tests the memory cells in the rows of the array. In case of test failure, an error detection unit provides an error indication identifying the bit that failed. A control block keeps track of the errors, and decides whether to repair the failure with one of the redundant rows or the redundant columns.

U.S. Pat. No. 6,304,499, whose disclosure is likewise incorporated herein by reference, describes a semiconductor memory having redundant units of memory cells, along with a method of self-repair. A self-test unit carries out a functional test of the memory cells with a defined memory-retention time for the memory cell contents. The results of the test are analyzed to determine which of the normal memory units are to be replaced by redundant units. The memory units are programmed in accordance with the analysis result.

All the self-repair schemes described above require complex BIST circuits to identify the addresses of the faulty cells, along with address translation logic to redirect read and write data from faulty cells to the redundant cells that are substituted for them. Such BIST and addressing circuits occupy a substantial area on the chip, thus increasing the overall device cost and potentially reducing yield. Furthermore, as noted in the above-mentioned U.S. Pat. No. 5,920,515, the logic needed to identify reads and writes addressed to faulty cells and to look up the substitute redundant cell addresses reduces the access speed of the memory array. There is a need for a self-test and repair mechanism that overcomes these limitations of the prior art.

SUMMARY OF THE INVENTION

It is an object of the present invention to provide improved methods and device architectures for self-repair of memory arrays.

It is a further object of some aspects of the present invention to provide built-in self-repair circuitry for an embedded memory array that requires a minimal amount of space on the chip on which it is fabricated.

It is yet a further object of some aspects of the present invention to provide built-in self-repair circuitry for a memory array that does not significantly affect the access time of the array.

In preferred embodiments of the present invention, an embedded memory unit comprises an array of memory lines (rows and columns), including a redundant memory line, preferably a redundant column. In other words, assuming the memory unit is designed to hold n lines of data, the array actually comprises n+1 lines of memory cells. Selection circuitry is coupled to the array so as to select n of the n+1 lines to which the data are to be written and from which the data are to be read.

To determine which lines to use, a Built-In Self-Test (BIST) circuit writes test data to the array and then reads the data from the array. The BIST circuit compares the data read from the array to the data written thereto, and generates a binary (pass/fail) output indicating whether or not the data read from the array corresponded correctly to the test data written to the array. When the BIST output indicates that the self-test failed, a repair machine drives the selection circuitry to select different sets of n of the lines to hold the data. For each new selection, the repair machine triggers the BIST circuit to retest the memory array, until the binary output of the BIST circuit indicates that the data read from the array correspond correctly to the test data written to the array. In this case, the repair machine concludes that the faulty line has been repaired, and this selection is maintained during normal operation of the memory unit. If the selection circuitry cycles through all of the lines without passing the self-test, the repair machine returns a failure signal, indicating that the fault is irreparable.

Preferred embodiments of the present invention thus provide a self-repair mechanism for embedded memory arrays that is simple, reliable and requires little "real estate" on chip. Unlike self-repair circuits known in the art, which use complex BIST circuits to identify the addresses of faulty cells, the present invention requires only a minimal BIST circuit with a binary output. The BIST output enables the repair machine to know whether a fault exists and, if so, to determine when the fault has been successfully repaired. The selection circuitry adds little or no latency to memory readout, particularly when it is used to select a redundant column, rather than using redundant rows as in most self-repair mechanisms known in the art.

There is therefore provided, in accordance with a preferred embodiment of the present invention, an embedded memory unit, including:

a memory array having a design size given by an integer n, the array including:
a matrix of memory cells arranged in n+1 lines; and
selection circuitry, coupled to select n of the n+1 lines to which data are to be written and from which the data are to be read;

a built-in self-test (BIST) circuit, coupled to test the memory array by writing test data to the memory array, reading the data from the memory array, and comparing the data read from the array to the test data written thereto, and adapted to generate a binary output indicating whether or not the data read from the array correspond correctly to the test data written to the array; and a repair machine, coupled to receive the binary output of the BIST circuit and to drive the selection circuitry to select different sets of n of the lines while driving the BIST circuit to test the memory array, so as to find one of the different sets for which the binary output indicates that the data read from the array correspond correctly to the test data written to the array.

Preferably, the memory array is designed to store words of n bits in respective rows of the matrix, and the n+1 lines include n+1 columns of the matrix. Further preferably, the repair machine is adapted to find one of the columns that contains a fault, responsive to the binary output of the BIST circuit, and to drive the selection circuitry to select the n of the columns so as to bypass the column containing the fault. Most preferably, the repair machine is coupled to output a selection value indicating the columns to be selected by the selection circuitry, and the selection circuitry includes a first plurality of selectors, each coupled to a respective one of the columns of the matrix, and further coupled to receive two of the bits in each of the words to be written to one of the rows, and to select one of the two bits to write to the respective one of the columns responsive to the selection value. Additionally, the selection circuitry preferably includes a second plurality of selectors, each coupled to receive the bits read out from two of the columns of the matrix, and responsive to the selection value, to select one of the bits to include in a word that is output from the array.

Preferably, the repair machine is adapted to find one of the lines that contains a fault, responsive to the binary output of the BIST circuit, and to drive the selection circuitry to select the n of the lines so as to bypass the line containing the fault. Further preferably, the repair machine includes a repair register, which is adapted to hold a selection value indicating the line containing the fault, and the selection circuitry is adapted to select the n of the lines responsive to the selection value. Most preferably, the repair machine is adapted to vary the selection value so as to cause the selection circuitry to bypass each of the lines of the array in turn, and to drive the BIST circuit to test the memory array for each of the lines that is bypassed. Additionally, the repair machine is preferably adapted to vary the selection value and to drive the BIST circuit so as to test substantially all of the different sets of n of the lines in the array, and to determine that the fault in the array is not repairable if the binary output of the BIST circuit indicates that the data read from the array do not correspond correctly to the test data written to the array for any of the different sets.

There is also provided, in accordance with a preferred embodiment of the present invention, a method for self repair of a memory array having a design size given by an integer n, the array including a matrix of memory cells arranged in n+1 lines, the method including:

selecting n of the n+1 lines to which data are to be written and from which the data are to be read;

testing the selected lines of the memory array by writing test data to the memory array, reading the data from the memory array, and comparing the data read from the array to the test data written thereto;

generating a binary output indicating whether or not the data read from the array correspond correctly to the test data written to the array; and responsive to the binary output, repeating the above steps of selecting, testing and generating for different sets of n of the lines, so as to find one of the different sets for which the binary output indicates that the data read from the array correspond correctly to the test data written to the array.

The present invention will be more fully understood from the following detailed description of the preferred embodiments thereof, taken together with the drawings in which:

DETAILED DESCRIPTION OF PREFERRED EMBODIMENTS

Figure 1:
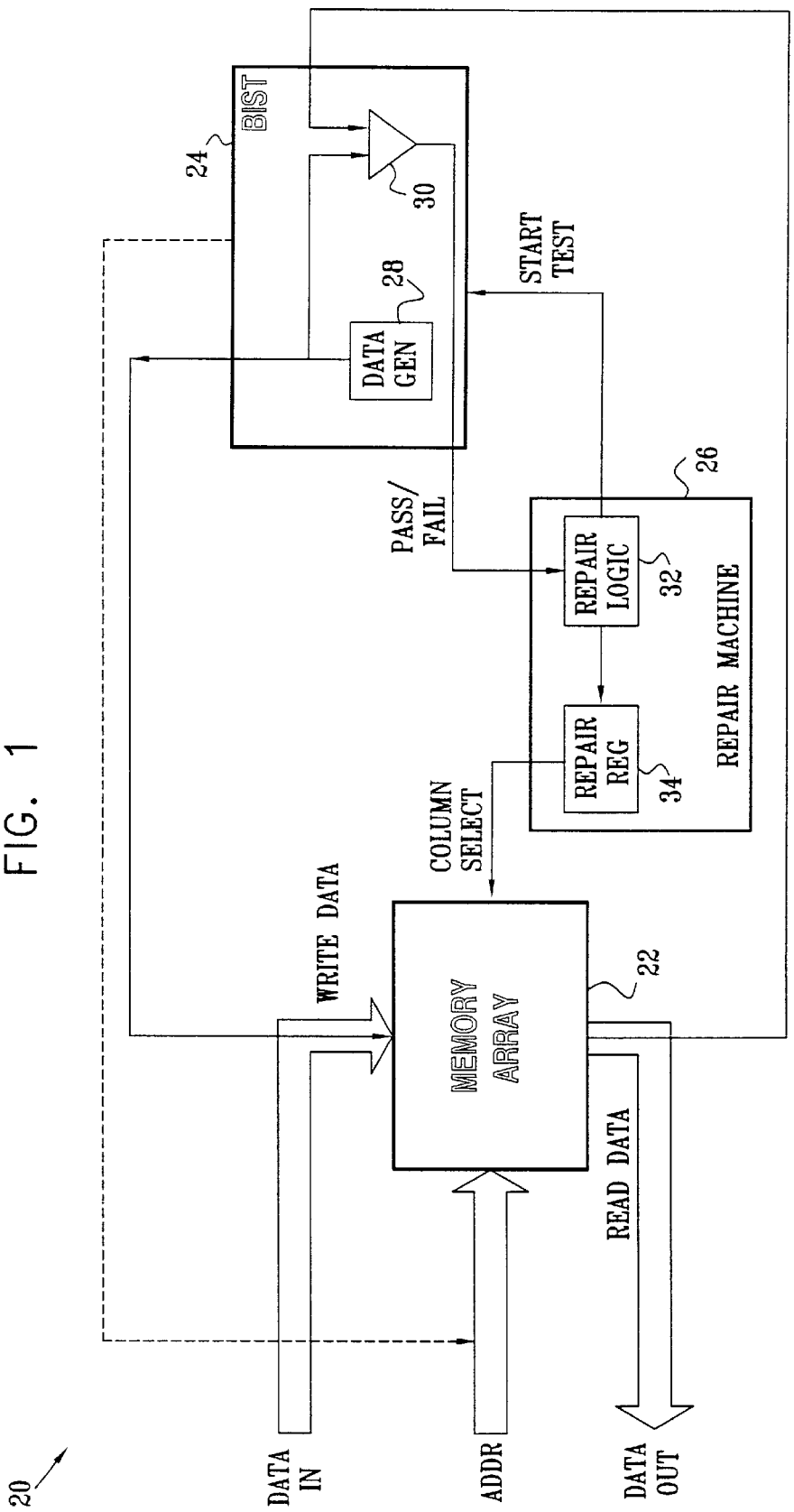
FIG. 1 is a block diagram that schematically illustrates an embedded memory unit, in accordance with a preferred embodiment of the present invention.

FIG. 1 is a block diagram that schematically illustrates a memory unit 20 with self-repair capability, in accordance with a preferred embodiment of the present invention. The memory unit is typically embedded in a semiconductor processing chip, such as a network interface adapter, and is used for on-chip storage and recall of data by other elements on the chip. For this purpose, unit 20 comprises a memory array 22, which has data input/output connections and address connections, as are known in the art, by means of which the other elements on the chip can write data to and read data from the array. Array 22 preferably comprises a redundant column of memory cells, which is used in self-repair of memory faults, as described below. Details of memory array 22 are shown in FIG. 2.

Memory unit 20 further comprises a Built-In Self-Test (BIST) circuit 24 and a repair machine 26, for detecting and repairing faults in memory array 22. BIST circuit 24 comprises a data generator 28, which outputs a pattern of test data for writing to the cells of array 22. The BIST circuit reads the data out of array 22, and compares these data to the test data output by data generator 28 using a comparator 30. If the data read out of the array match the test data written to the array, comparator 30 generates a "pass" output (for example, binary 1), indicating that the array is working properly. Otherwise, comparator 30 generates a "fail" output (binary 0).

Repair machine 26 comprises repair logic 32 and a repair register 34. The repair register holds a value indicating which column of cells, if any, in array 22 is to be selected for replacement using the redundant column. At start-up of memory unit 20, repair register 34 is set to some initial value, so that one column of array 22 is unused. If BIST circuit 24 outputs a "pass" result, the repair register value is unchanged. If a BIST failure occurs, however, repair logic 32 sets a new value in repair register 34 and then prompts the BIST circuit to repeat the self-test. Details of this process are described below with reference to FIG. 4. It continues until the repair logic has set a value in the repair register that causes BIST circuit 24 to return a "pass" result, or until all possible values of the repair register have been tested. Once the BIST circuit has given a "pass" output, normal operation of memory unit 20 can proceed, using the current setting in the repair register.

Figure 2:
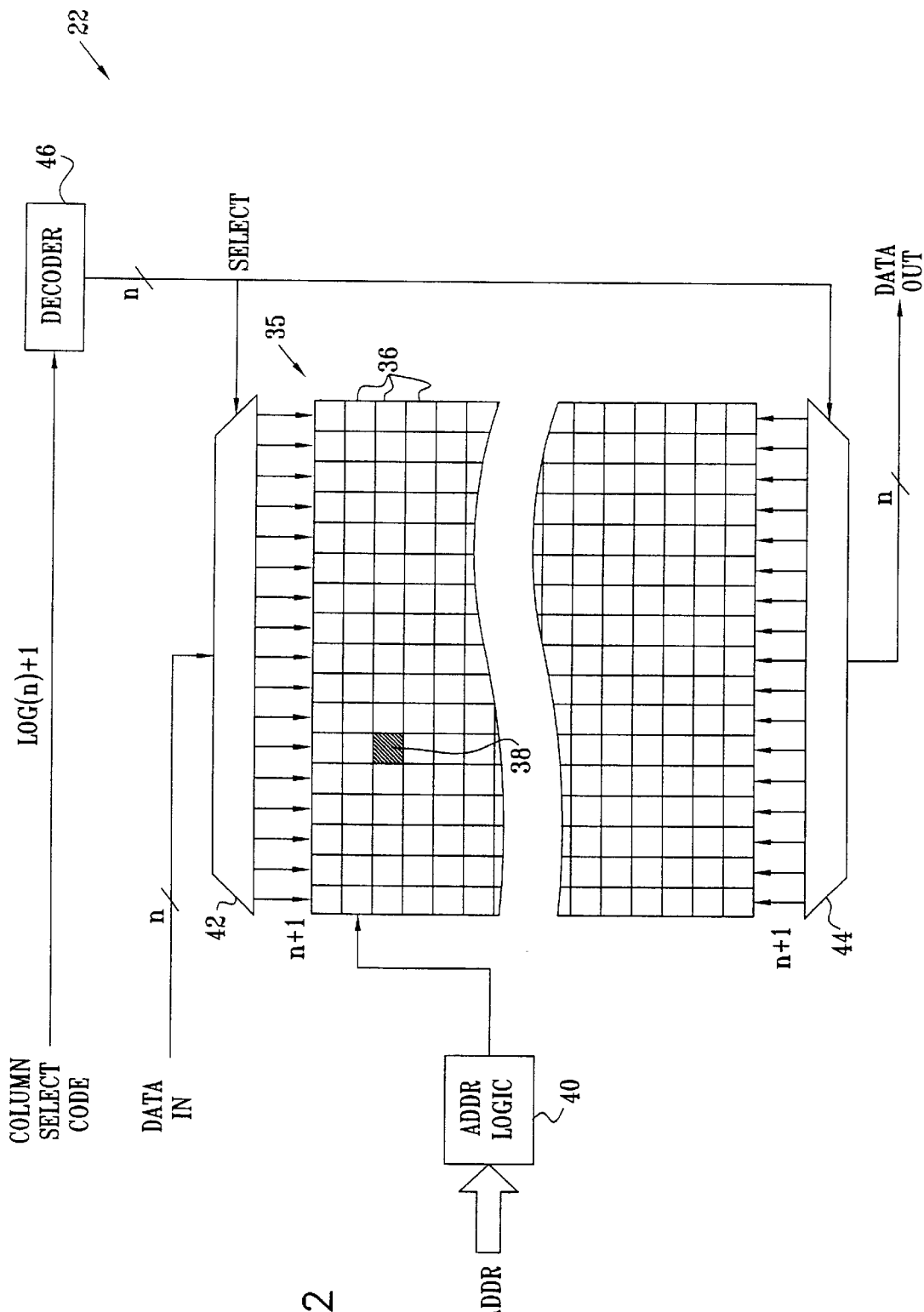
FIG. 2 is a block diagram that schematically illustrates a memory array with a redundant column and associated selection logic, in accordance with a preferred embodiment of the present invention.

FIG. 2 is a block diagram that schematically shows details of memory array 22, in accordance with a preferred embodiment of the present invention. Array 22 is built around a matrix 35 of memory cells 36. Matrix 35 is configured to hold an array of n-bit words, one word per row of the array. (In the present example, n=16.) Addressing logic 40 selects the word to read or write each time array 22 is accessed. In order to enable operation of array 22 even in the presence of a faulty cell 38, matrix 35 includes n+1 columns. Multiplexing logic 42 selects the n columns of matrix 35 to which data are to be written, so as to bypass the column containing faulty cell 38. Demultiplexing logic 44 selects these same columns to read out n-bit words of data from the matrix. Although FIG. 2 shows an example of column selection to avoid a faulty cell, the multiplexing and demultiplexing logic are useful, as well, for bypassing a column of matrix 35 in which another fault has occurred, such as a fault in the column sense amplifier (not shown).

Multiplexing logic 42 and demultiplexing logic 44 are controlled, as noted above, by a column select value that is stored in repair register 34 (FIG. 1). Since there are n+1 columns that can be selected, the value output by the repair register has $\log_2(n)+1$ bits, i.e., five bits in the current example. A decoder 46 converts the selection value into a n-bit select word for controlling logic 42 and 44, as described below.

Figure 3A:
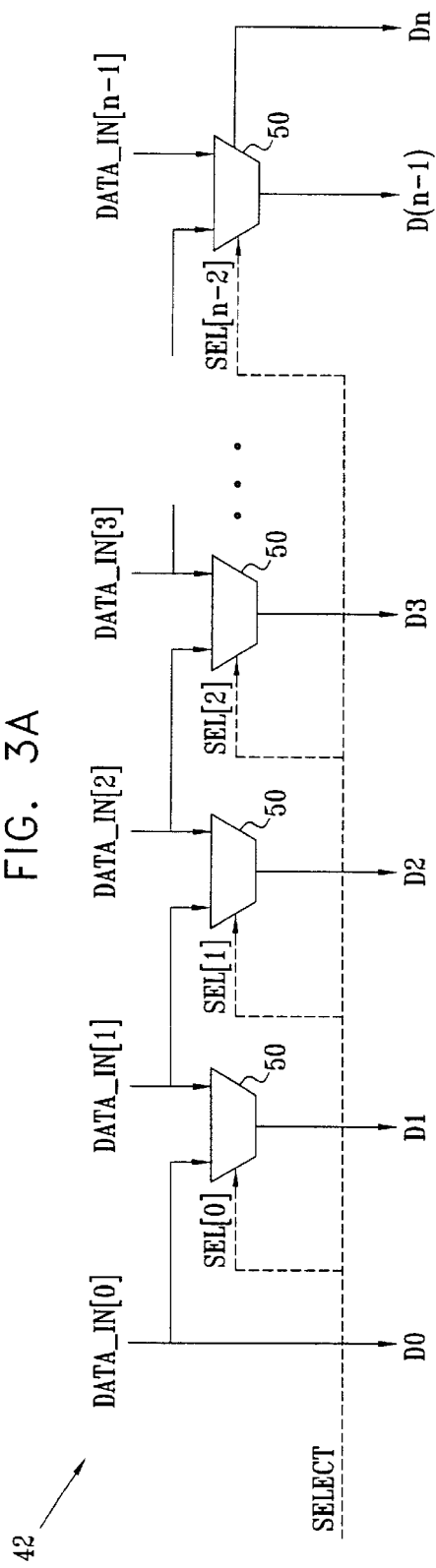
FIGS. 3A and 3B are block diagrams that schematically show details of the selection logic used in the memory array of FIG. 2, in accordance with a preferred embodiment of the present invention.
Figure 3B:
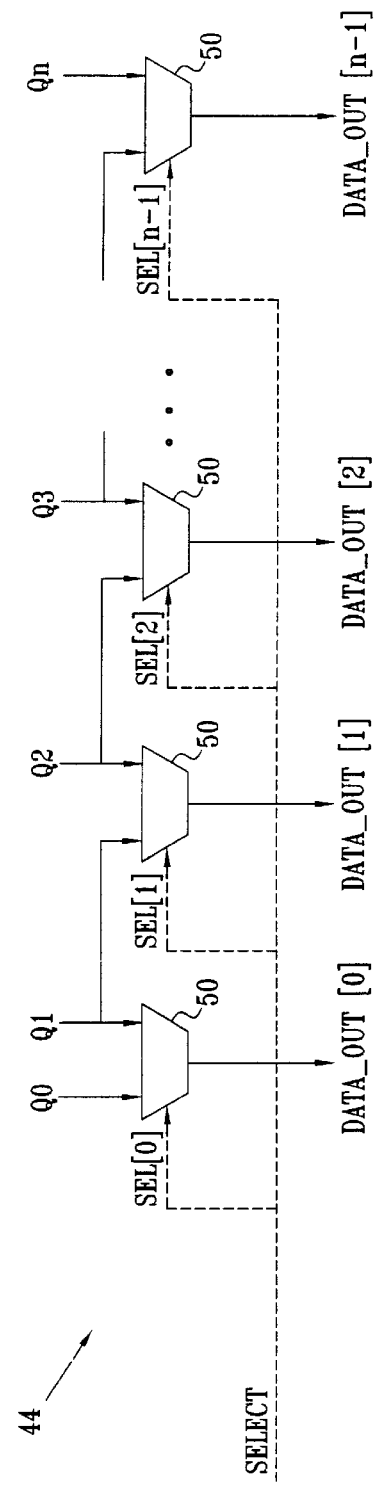

FIGS. 3A and 3B are block diagrams that schematically show details of multiplexing logic 42 and demultiplexing logic 44, respectively, in accordance with a preferred embodiment of the present invention. For the purposes of these figures, the n+1 columns of matrix 35 are identified as columns 0 through n, having inputs D0, D1, . . . , Dn, and outputs Q0, Q1, . . . , Qn.

Logic 42 comprises n−1 selectors 50, whose outputs are respectively connected to D1 through D(n−1). D0 always receives DATA_IN[0], while Dn receives DATA_IN[n−1]. For the other columns, the selector that feeds input Di receives two inputs: DATA_IN[i−1] and DATA_IN[i]. Selection of the input Di is determined by bit i−1 of the select word, SEL[i−1]. The select word is determined so that if there is a fault in a given column of matrix 35, the selectors to the left of the faulty column receive SEL[i−1]=0, and accordingly select DATA_IN[i−1], while the selectors to the right of the faulty column receive SEL[i−1]=1, and select DATA_IN[i]. When there are no faulty columns, all bits of SEL are preferably set to zero as a default.

Logic 44 similarly comprises n selectors 50, whose outputs provide bits DATA_OUT[0] through DATA_OUT[n−1], respectively. The operation of the selectors in logic 44 is complementary to that of logic 42. Therefore, if SEL[i]=0, the corresponding selector in logic 44 will provide Qi as output DATA_OUT[i], whereas if SEL[i]=1, then Q(i+1) feeds DATA_OUT[i].

Table I below lists the correspondence between values of the selection value read out of register 34, select word SEL, and the column of matrix 35 that is unused for each value, for the exemplary 16-bit memory array shown in FIG. 2. The 17 columns of the array are numbered 0 through 16, as in FIGS. 3A and 3B.

TABLE I

COLUMN SELECTION

| Selection value | Select word | Unused column |
|---|---|---|
| 0 | 0000000000000000 | 16 (default) |
| 1 | 1111111111111111 | 0 |
| 2 | 1111111111111110 | 1 |
| 3 | 1111111111111100 | 2 |
| 4 | 1111111111111000 | 3 |
| 5 | 1111111111110000 | 4 |
| 6 | 1111111111100000 | 5 |
| 7 | 1111111111000000 | 6 |
| 8 | 1111111110000000 | 7 |
| 9 | 1111111100000000 | 8 |
| 10 | 1111111000000000 | 9 |
| 11 | 1111110000000000 | 10 |
| 12 | 1111100000000000 | 11 |
| 13 | 1111000000000000 | 12 |
| 14 | 1110000000000000 | 13 |
| 15 | 1100000000000000 | 14 |
| 16 | 1000000000000000 | 15 |

Figure 4:
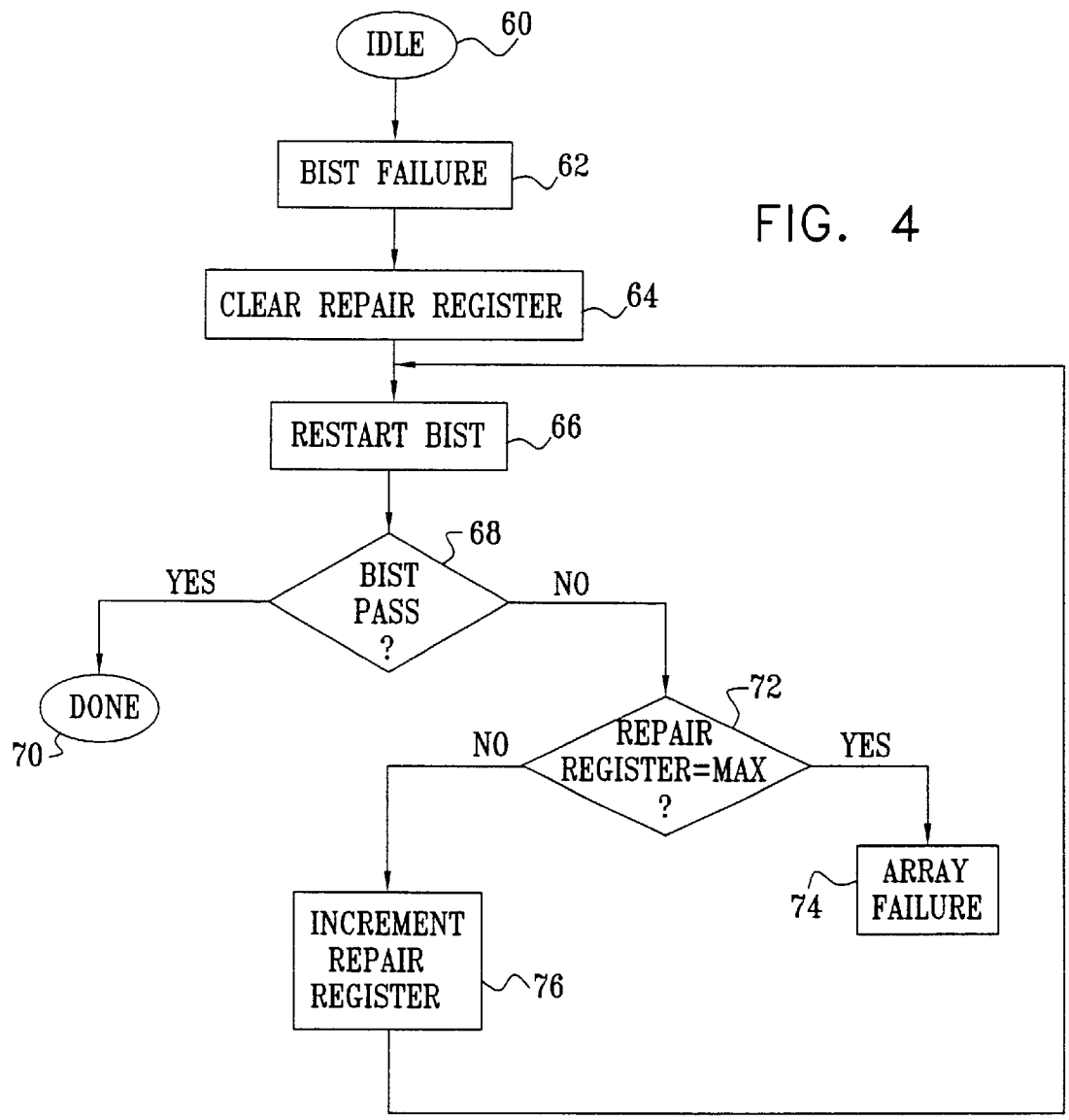
FIG. 4 is a flow chart that schematically illustrates a method for self-repair of an embedded memory unit, in accordance with a preferred embodiment of the present invention.

FIG. 4 is a flow chart that schematically illustrates the operation of repair machine 26 in testing and repairing array 22, in accordance with a preferred embodiment of the present invention. Initially, when memory unit 20 is powered up or reset, repair logic 32 is in an idle state 60, while BIST circuit 24 tests array 22. As long as the BIST circuit generates a "pass" output, indicating that the data read out of the array matched the test data written to the array, the repair logic remains idle, as there is no need for memory repair. If the BIST fails, however, repair logic 32 become active, at a BIST failure step 62. In this mode, the repair logic begins by clearing repair register 34, i.e., setting the column selection value to zero, at a register clearing step 64. The repair logic then prompts BIST circuit 24 to repeat the BIST procedure, at a BIST restart step 66.

Upon completion of the self-test, repair logic 32 receives the BIST output, at a BIST conclusion step 68. If the BIST output is "pass," the repair procedure is done, and the repair machine returns to its idle state, at a completion step 70. At this point, the memory array is ready for normal operation, using the column selection value that is stored in register 34. If the BIST output is "fail," however, repair logic 32 checks the value in the repair register, at a register checking step 72. As long as the column selection value in the register has not reached its maximum (16, in the example shown in Table I), repair logic 32 increments the selection value, at a register increment step 76. As can be seen in Table I, each time the code value is incremented, multiplexing logic 42 and demultiplexing logic 44 are reprogrammed to bypass the next column in matrix 35, beginning from column 0 and moving one column to the right at each iteration. At each iteration, the repair logic prompts BIST circuit 24 to repeat the BIST procedure at step 66.

This cycle continues until the BIST circuit returns a "pass" output at step 68, or until the column select code value has been incremented up to its maximum value, as determined at step 72. In the example shown in FIG. 2, the cycle will terminate when column 5 is bypassed. If the cycle reaches the maximum column selection value without passing the self-test, repair logic 32 concludes that the memory fault is irreparable and returns a failure indication, at a failure step 74. Such a failure may occur, for example, if there are faulty cells in two or more different columns of matrix 35 or in an entire row.

Although in the preferred embodiment described above, the circuitry in memory unit 20 and its mode of operation are directed to replacing faulty columns of array 22, the principles of the present invention may likewise be applied to replacing faulty rows. In this case, the memory array includes a redundant row, and faulty row replacement is typically performed by addressing logic 40. The selection of the row to be replaced is similarly based on a repair register value generated by repair logic 32. The procedure of FIG. 4 is modified so that the repair logic steps through the rows of the array, rather than the columns, until either BIST circuit 24 returns a "pass" output, or until it has reached the last row. A larger number of iterations will generally be required in order to find a faulty row, since embedded memory arrays are typically much deeper than they are wide. Clearly, full-column defects, such as a fault in the column sense amplifier, cannot be repaired in this manner. Also, whereas column-oriented selection logic, as shown in FIGS. 3A and 3B, is capable of operating in a single clock cycle, addition of faulty row bypassing to addressing logic 40 is typically more costly in terms of memory latency.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An embedded memory unit, comprising:
    a memory array having a design size given by an integer n, the array comprising:
        a matrix of memory cells arranged in n+1 lines; and
        selection circuitry, coupled to select n of the n+1 lines to which data are to be written and from which the data are to be read;
    a built-in self-test (BIST) circuit, coupled to test the memory array by writing test data to the memory array, reading the data from the memory array, and comparing the data read from the array to the test data written thereto, and adapted to generate a binary output indicating whether or not the data read from the array correspond correctly to the test data written to the array; and
    a repair machine, coupled to receive the binary output of the BIST circuit and to drive the selection circuitry to select different sets of n of the lines while driving the BIST circuit to test the memory array, so as to find one of the different sets for which the binary output indicates that the data read from the array correspond correctly to the test data written to the array.

2. A unit according to claim 1, wherein the memory array is designed to store words of n bits in respective rows of the matrix, and wherein the n+1 lines comprise n+1 columns of the matrix.

3. A unit according to claim 2, wherein the repair machine is adapted to find one of the columns that contains a fault, responsive to the binary output of the BIST circuit, and to drive the selection circuitry to select the n of the columns so as to bypass the column containing the fault.

4. A unit according to claim 3, wherein the repair machine is coupled to output a selection value indicating the columns to be selected by the selection circuitry, and wherein the selection circuitry comprises a first plurality of selectors, each coupled to a respective one of the columns of the matrix, and further coupled to receive two of the bits in each of the words to be written to one of the rows, and to select one of the two bits to write to the respective one of the columns responsive to the selection value.

5. A unit according to claim 4, wherein the selection circuitry further comprises a second plurality of selectors, each coupled to receive the bits read out from two of the columns of the matrix, and responsive to the selection value, to select one of the bits to include in a word that is output from the array.

6. A unit according to claim 1, wherein the repair machine is adapted to find one of the lines that contains a fault, responsive to the binary output of the BIST circuit, and to drive the selection circuitry to select the n of the lines so as to bypass the line containing the fault.

7. A unit according to claim 6, wherein the repair machine comprises a repair register, which is adapted to hold a selection value indicating the line containing the fault, and wherein the selection circuitry is adapted to select the n of the lines responsive to the selection value.

8. A unit according to claim 7, wherein the repair machine is adapted to vary the selection value so as to cause the selection circuitry to bypass each of the lines of the array in turn, and to drive the BIST circuit to test the memory array for each of the lines that is bypassed.

9. A unit according to claim 8, wherein the repair machine is adapted to vary the selection value and to drive the BIST circuit so as to test substantially all of the different sets of n of the lines in the array, and to determine that the fault in the array is not repairable if the binary output of the BIST circuit indicates that the data read from the array do not correspond correctly to the test data written to the array for any of the different sets.

10. A method for self repair of a memory array having a design size given by an integer n, the array including a matrix of memory cells arranged in n+1 lines, the method comprising:

selecting n of the n+1 lines to which data are to be written and from which the data are to be read;

testing the selected lines of the memory array by writing test data to the memory array, reading the data from the memory array, and comparing the data read from the array to the test data written thereto;

generating a binary output indicating whether or not the data read from the array correspond correctly to the test data written to the array; and responsive to the binary output, repeating the above steps of selecting, testing and generating for different sets of n of the lines, so as to find one of the different sets for which the binary output indicates that the data read from the array correspond correctly to the test data written to the array.

11. A method according to claim 10, wherein the memory array is designed to store words of n bits in respective rows of the matrix, and wherein selecting the n of the n+1 lines comprises selecting n columns of the matrix.

12. A method according to claim 11, wherein repeating the above steps comprises repeating the steps so as to find one of the columns that contains a fault, and to select the n columns so as to bypass the column containing the fault.

13. A method according to claim 12, wherein selecting the n columns comprises coupling each of a first plurality of selectors to a respective one of the columns of the matrix, and coupling each of the selectors to receive two of the bits in each of the words to be written to one of the rows, and driving the selectors to select one of the two bits to write to the respective one of the columns responsive to a selection value indicative of the one of the columns containing the fault.

14. A method according to claim 13, wherein selecting the n columns further comprises coupling each of a second plurality of selectors to receive the bits read out from two of the columns of the matrix, and responsive to the selection value, driving each of the second plurality of selectors to select one of the bits to include in a word that is output from the array.

15. A method according to claim 10, wherein repeating the above steps comprises repeating the steps so as to find one of the lines that contains a fault, and to select the n lines so as to bypass the line containing the fault.

16. A method according to claim 15, wherein repeating the steps comprises finding a selection value indicating the line containing the fault, and wherein selecting the n of the lines comprises selecting the lines responsive to the selection value.

17. A method according to claim 16, wherein repeating the steps comprises varying the selection value so as to cause each of the lines of the array to be bypassed in turn, until the binary output indicates that the data read from the array correspond correctly to the test data written to the array when one of the lines is bypassed.

18. A method according to claim 17, wherein varying the selection value comprises controlling the selection value so as to test substantially all of the different sets of n of the lines in the array, and comprising determining that the fault in the array is not repairable if the binary output indicates that the data read from the array do not correspond correctly to the test data written to the array for any of the different sets.

* * * * *